(12) United States Patent
Aburto

(10) Patent No.: US 11,001,164 B1
(45) Date of Patent: May 11, 2021

(54) ELECTRIC VEHICLE WITH RECHARGEABLE BATTERY AND DUAL-PURPOSE ELECTRIC MOTORS

(71) Applicant: Isaac M Aburto, Saint Charles, IL (US)

(72) Inventor: Isaac M Aburto, Saint Charles, IL (US)

(*) Notice: Subject to any disclaimer, the term of this patent is extended or adjusted under 35 U.S.C. 154(b) by 239 days.

(21) Appl. No.: 16/170,027

(22) Filed: Oct. 24, 2018

Related U.S. Application Data

(60) Provisional application No. 62/576,507, filed on Oct. 24, 2017.

(51) Int. Cl.
| | |
|---|---|
| *B60K 1/00* | (2006.01) |
| *B60L 58/22* | (2019.01) |
| *H02K 53/00* | (2006.01) |
| *G01R 19/165* | (2006.01) |
| *G01R 31/392* | (2019.01) |
| *B60L 58/12* | (2019.01) |
| *H02J 7/00* | (2006.01) |

(52) U.S. Cl.
CPC ............. *B60L 58/22* (2019.02); *B60L 58/12* (2019.02); *G01R 19/16542* (2013.01); *G01R 31/392* (2019.01); *H02J 7/0069* (2020.01); *H02K 53/00* (2013.01)

(58) Field of Classification Search
CPC .......... B60L 58/22; B60L 58/00; B60L 58/12; B60L 58/26; B60L 58/27; B60L 58/15; B60L 58/14; B60L 58/25; B60L 50/64; B60L 50/00; B60L 50/14; B60L 50/50; B60L 50/60; B60H 1/004; B60H 1/00492; B60H 1/00385; B60H 1/00392; B60H 1/14; B60H 1/143; H02J 7/00; H02J 7/0069; H02J 7/007192; H02J 7/007194; H02J 7/007
See application file for complete search history.

(56) References Cited

U.S. PATENT DOCUMENTS

| | | | | |
|---|---|---|---|---|
| 5,327,987 | A * | 7/1994 | Abdelmalek | B60K 6/52 180/65.25 |
| 7,380,586 | B2 * | 6/2008 | Gawthrop | B60H 1/004 165/202 |
| 7,806,796 | B2 * | 10/2010 | Zhu | F16H 47/04 475/73 |
| 7,854,282 | B2 * | 12/2010 | Lee | B60W 20/00 180/65.24 |
| 8,035,349 | B2 * | 10/2011 | Lubawy | H02J 7/1461 320/150 |

(Continued)

*Primary Examiner* — James M Dolak
(74) *Attorney, Agent, or Firm* — Steven Ivy P.C.

(57) ABSTRACT

An improved electric vehicle powered by a plurality of rechargeable batteries which are discharged and simultaneously charged during the vehicle's operation. The batteries are discharged as the energy used to operate the vehicle is drawn from the batteries. The operation of the vehicle activates two power systems configured to generate voltage and to recharge the depleting batteries. The two power systems are: (1) dual-purpose electric motors configured to convert the mechanical energy created by the rotation of the vehicle's wheels into electric current; and (2) a thermocouple which converts energy created by temperature difference between two objects into voltage, a process commonly known as the thermoelectric effect or Seebeck effect.

9 Claims, 9 Drawing Sheets

(56) References Cited

U.S. PATENT DOCUMENTS

| | | | | |
|---|---|---|---|---|
| 8,786,260 B2* | 7/2014 | Takatsuji | ............... | B60L 3/0046 |
| | | | | 320/150 |
| 8,935,023 B2* | 1/2015 | Hirota | ............... | B60W 50/0097 |
| | | | | 701/22 |
| 9,321,463 B2* | 4/2016 | Nakamura | ............... | B60L 50/51 |
| 9,337,680 B2* | 5/2016 | Gibeau | ............... | B60L 58/22 |
| 10,717,367 B1* | 7/2020 | Price | ............... | B60L 53/302 |
| 10,876,497 B2* | 12/2020 | Munevar | ............... | F01N 5/02 |
| 10,906,376 B2* | 2/2021 | Enomoto | ............... | B60H 1/32284 |
| 10,910,680 B2* | 2/2021 | Fleming | ............... | H01M 10/6568 |
| 10,913,369 B2* | 2/2021 | Rhodes | ............... | B60L 58/26 |
| 2006/0028167 A1* | 2/2006 | Czubay | ............... | B60W 20/13 |
| | | | | 320/104 |
| 2013/0175022 A1* | 7/2013 | King | ............... | B60H 1/00392 |
| | | | | 165/202 |

* cited by examiner

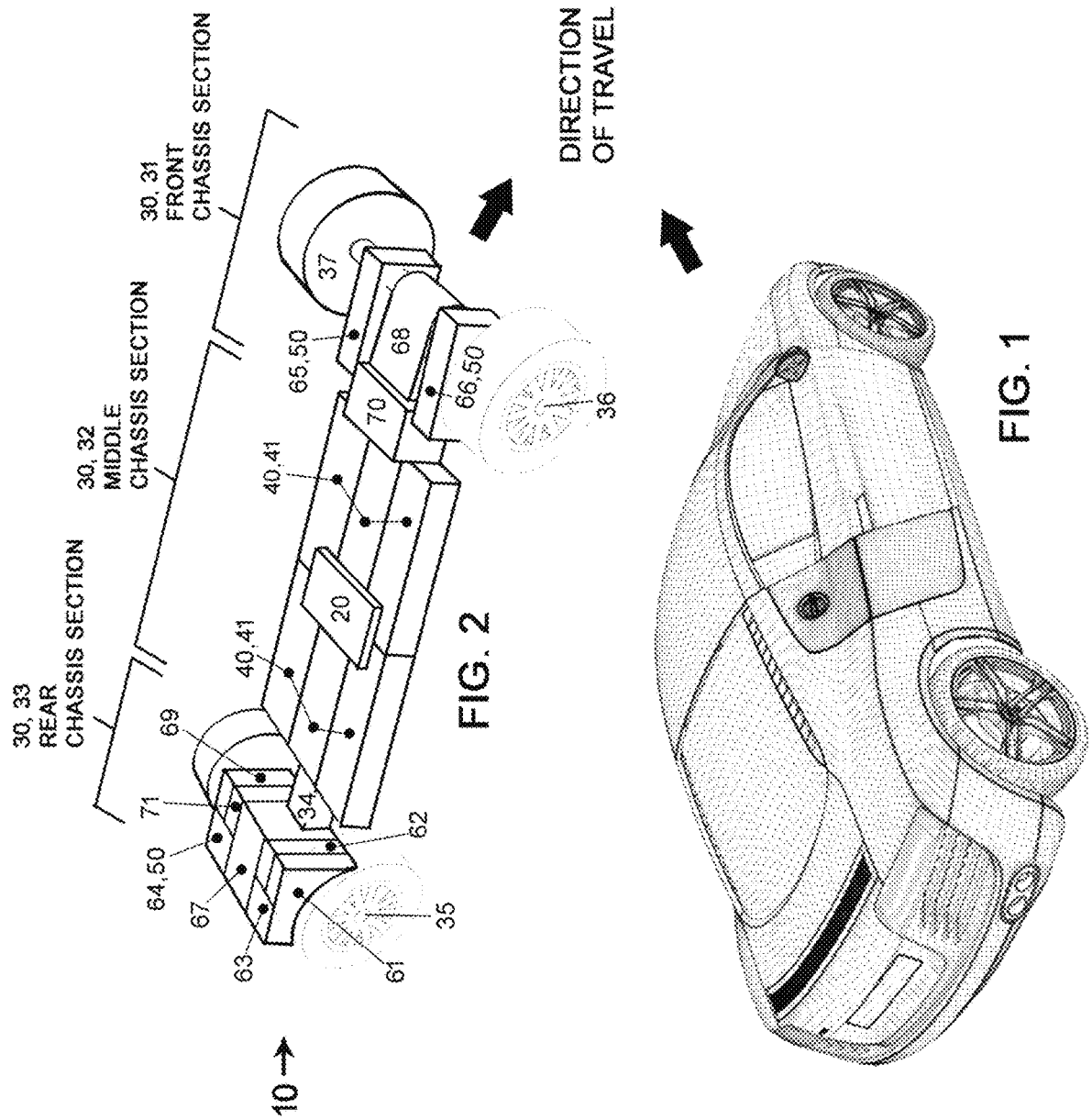

ELECTRIC VEHICLE WITH RECHARGEABLE BATTERY AND DUAL-PURPOSE ELECTRIC MOTORS

RELATED PATENT APPLICATION

The present Non-Provisional U.S. Patent Application claims priority under 35 U.S.C. § 119(e) to U.S. Provisional Patent Application No. 62/576,507 tiled SELF-RE-CHARGEABLE ELECTRIC VEHICLE SYSTEM, filed on Oct. 24, 2017, the subject matter of which is incorporated herein by reference.

FIELD OF THE INVENTION

The present invention addresses the general field of electric vehicles.

BACKGROUND OF THE INVENTION

In the last decade, the ongoing improvements in electronics and renewable energy, specifically battery cells, has sparked an increase in production of electric cars (EV) in the United States. Said increase is quite evident by reviewing the sales numbers from 2016; wherein the 70% year-over-year increase in monthly sales continued from the very beginning of the year. Following a 5% decline in sales from 2014 to 2015, U.S. EV sales jumped by 37% in 2016. By year-end there were about 30 different EV offerings, with a total sales of 159,139 vehicles.

The increase in sales of EV cars may also be attributed to many well known benefits of EV cars. Compared with cars with internal combustion (IC) engines, electric cars are quieter and have no tailpipe emissions. When recharged by low-emission electrical power sources, electric vehicles can reduce greenhouse gas emissions compared to IC engines.

However, not all EV cars are made in the same way, or work the same way. Specifically, the EV market may be subdivided into two classes; 1) plug-in hybrids; 2) non-combustion cars (also known as the battery-powered, or fuel-cell powered cars). The plug-in hybrids offer both a gasoline or diesel engine and an electric motor; wherein said motor is powered by a battery that can be recharged by plugging in. The non-combustion cars forgo liquid fuels entirely, operating exclusively on electricity (rechargeable internal battery); or utilize electric motors that convert hydrogen gas into electricity (known as the hydrogen fuel cell vehicles).

Perhaps the biggest problem with the currently-available, non-combustion cars, relates to regeneration of the source of power, the internal batteries. Most of these internal car batteries must be regenerated, or recharged daily. The process of recharging the batteries is frequently cumbersome and time consuming. The recharging process takes many hours, and the recharging of the batteries must be done at some designated recharging stations, or at the driver's home.

The defined-above recharging requirements lead to the main issue confronting today's non-combustion cars is the travel range (or the limited distance the car can travel, before the recharging process of its battery must be reinitiated). Most cars currently on the market, have the travel range of 150 miles to approximately 300 miles. This range may be sufficient for typical inner-city commutes, but it would be quite insufficient for cross-country, family trips.

The present invention addresses the above-defined shortcomings of the non-combustive electric vehicles, by introducing a self-rechargeable, electric vehicle. A vehicle that converts the mechanical energy generated by the rotation of its wheels, into direct current, recycled to continuously recharge its primary source of propulsion, the onboard, lithium-ion battery system.

SUMMARY OF THE INVENTION

The following information is intended to be a brief summary of the invention, and as such, said information shall not be used as the means of limiting the scope of the invention:

The present invention discloses a synergous, self-rechargeable electric vehicle with dual-purpose motors, or AC motor/DC generator systems. The vehicle, via a synergetic usage of dual-purpose motors AC motor/DC generator systems, converts the mechanical energy created by the rotation of the vehicles wheels, into electric current, used for continuous recharging of the vehicle's lithium-ion battery, the vehicle's primary source of propulsion.

The invention comprises of nine primary components, disposed on a dual-axle chassis: 1) a plurality of rechargeable batteries, incorporating thermo-electric generator plates, designed to take advantage of the Seebeck Effect to generate the electric current; 2) smart controller, designed to control the vehicle's charging and recharging cycle; 3) dual-purpose AC motor/DC generator system, positioned at the rear and the front chassis sections, designed to operate in unison, interchangeably powering the vehicle's movement, and generating the electric current for recharging the batteries; 4) external charger, AC to DC converter, providing external means for recharging the vehicle's batteries; 5) thermo DC power supply, designed to convert the electricity gathered by the thermo-electric accumulator into direct current; 6) hot swap voltage controller, made for controlling the current drawn from the vehicle's battery to charge the AC motors; 7) dual-purpose AC motor/DC generator system, designed to incorporate a high-torque AC motor made to propel the vehicle, and simultaneously capable of generating direct current (DC) used for recharging the vehicle's batteries; 8) gearbox, used on the front and the back axle, mechanically connecting the AC motor with the axles of the vehicle, enabling their rotation; 9) power supply and battery chargers, uses the current collected from DC generators for recharging of the vehicle's batteries.

BRIEF DESCRIPTION OF THE DRAWINGS

The components shown in the drawings are not to scale. In the interest of clarity, some of the components might be shown in a generalized form and could be identified utilizing commercial designations. All components, including its essential features, have been assigned reference numbers that are utilized consistently throughout the descriptive process outlined herein:

FIG. 1 is a perspective view of the external fuselage of a vehicle, which may be utilized as an enclosure of the electric vehicle's chassis and attached thereto mechanical and electrical components, in accordance with an exemplary embodiment of the present invention;

FIG. 2 is a perspective view of a vehicle's chassis, sub-divided into three sections: 1) front; 2) middle; 3) rear; shown with four wheels attached thereto, supporting all the primary components of the invention, including: smart controller; rechargeable batteries; thermo AC power supply; hot swap voltage controller (battery discharge); AC to DC convertor; dual purpose electric motor (main rear); dual purpose electric motor (left front); dual purpose electric motor (right front); gearbox (rear differential); gearbox (front differential); power supply battery charger; power supply and charge controller; hot swap voltage controller (battery charger).

DESCRIPTIVE KEY

Figure 3:
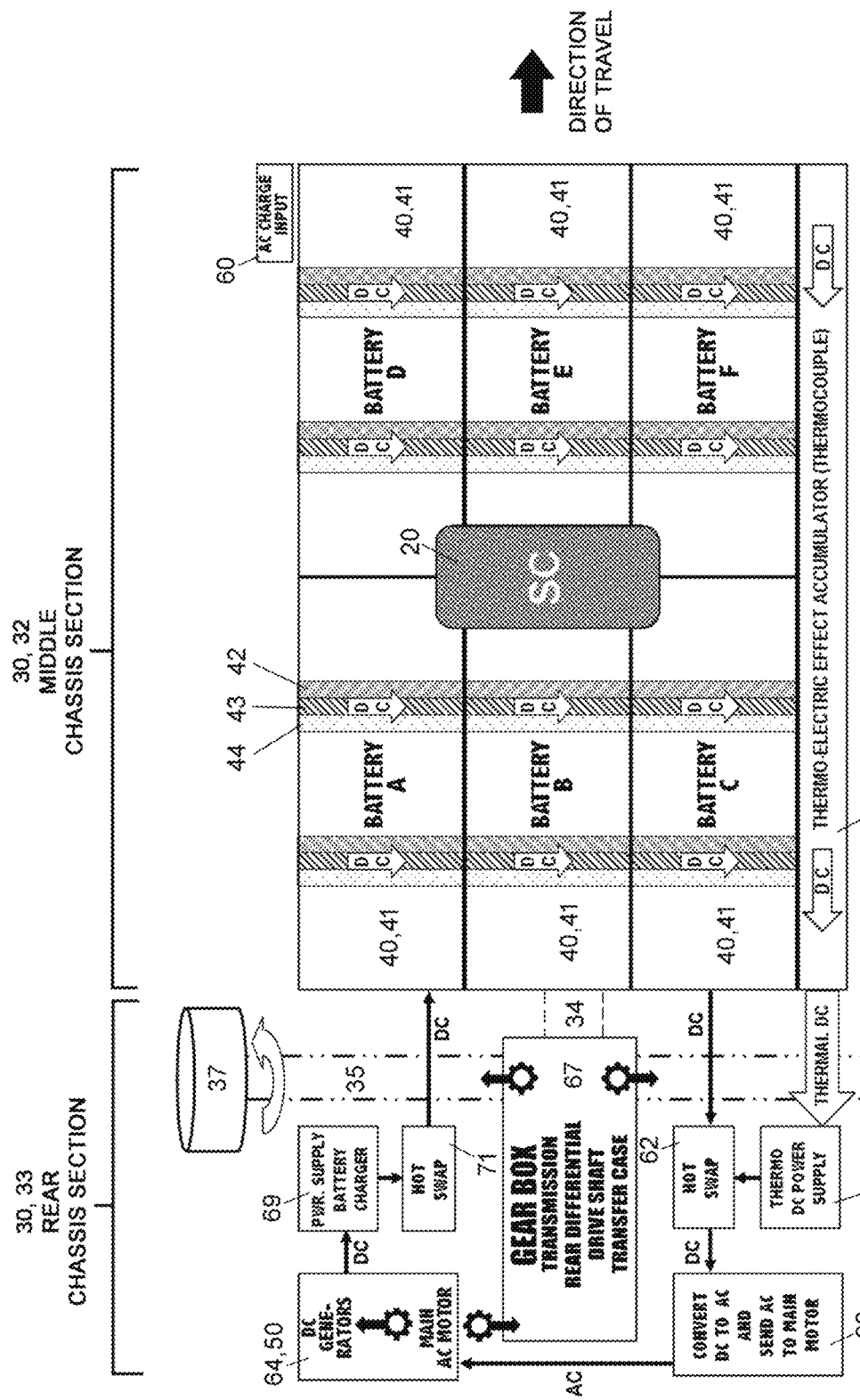
FIG. 3 is a diagram, showing the top view of the vehicle's rear and middle chassis sections; wherein said middle chassis section houses the six rechargeable batteries and the smart controller (designed to manage the batteries' charging process); and the rear chassis section, supported by the vehicle's rear axle, houses the rear gearbox, main dual-purpose AC motor/DC generator, hot swap voltage controllers and the power supply, in accordance with an exemplary embodiment of the present invention.

10—electric vehicle
20—smart controller
30—vehicle chassis
31—front section, chassis
32—middle section, chassis
33—rear section, chassis
34—drive shaft
35—rear axle
36—front axle
37—wheels
40—battery
41—charging cells
42—cooling compartment
43—semiconductor compartment
44—heating compartment
45—thermal-electric accumulator
50—dual-purpose AC motor/DC generator system
51—AC motor frame (housing the rotor)
52—AC motor shaft
53—AC motor generators gear
54—AC motor drive gear
55—DC generator frame
56—DC generator shaft
57—DC generator gear
58—enclosure (housing AC motor & DC generators)
60—external charger (AC to DC convertor)
61—thermo DC power supply
62—hot swap voltage controller (battery discharge)
63—DC to AC convertor
64—dual-purpose AC motor/DC generator system (main rear)
65—dual-purpose AC motor/DC generator system (left front)
66—dual-purpose AC motor/DC generator system (right front)
67—gearbox (rear differential)
68—gearbox (front differential)
69—power supply battery charger
70—power supply and charge controller
71—hot swap voltage controller (battery charger)

DETAILED DESCRIPTION OF THE PREFERRED EMBODIMENT

The following description references to the above-defined drawings and represents only an exemplary embodiment of the invention. It is foreseeable, and recognizable by those skilled in the art, that various modifications and/or substitutions to the invention could be implemented without departing from the scope and the character of the invention:

As shown in FIGS. 1 and 2, the present invention discloses a self-rechargeable electric vehicle 10, incorporating dual-purpose AC motor/DC generator systems 50. When in operation, the thermo-electric current generators 42-45, incorporated in the vehicle's battery system 40 (shown in FIGS. 3-7), work in synergy with a plurality of dual-purpose AC motor/DC generator systems 50, which produce an ample amount of torque to propel the vehicle's 10 movement, or in alternative, generate enough electric current, to continuously recharge the vehicle's batteries—eliminating the need for costly and time-consuming external outlet charging process.

All the components of the electric vehicle 10 are disposed on a dual-axle chassis 30. The chassis has been sub-divided into three sections: (1) front section 33; (2) middle section 32; (3) rear section 31, shown in FIGS. 1-5.

The middle chassis section 32 houses the vehicle's rechargeable batteries 40, and the smart controller 20, designed to control the vehicle's 10 charging and recharging cycle. The initial usage of the vehicle will require connection to an external outlet. This connection is done via the external charger, AC to DC convertor 60, located near the battery 40. Once the batteries are charged, the vehicle may be operated indefinitely, by recycling the energy, generated by the vehicle's 10 motion.

The rear chassis section 33, houses the systems capable of operating the vehicle 10 in a rear-wheel drive mode. When in operation, the vehicle 10 draws the energy directly from its onboard batteries 40, and from the batteries-generated heat.

The heat of the onboard batteries 40 (shown in FIGS. 3, 4, 5, 7) is utilized to generate more energy, by taking advantage of the Seebeck Effect to generate the electric current. As show in FIGS. 6 and 7, the batteries 40 incorporate a thermal-electric plate system. Wherein a semiconductor compartment 43 is sandwiched between a heating compartment 44 (heated by the active battery) and the cooling compartment 42 (cooled by internal, flowing coolant). The active difference in temperatures between said compartments 42 and 44, allows the semiconductor 43 to produce current, which is directed toward the thermo electric accumulator 45. The accumulator 45 draws the current from multiple semi-conductors 43, and direct it toward the thermal DC power supply 61, shown in FIGS. 5, 7, 8.

Figure 8:
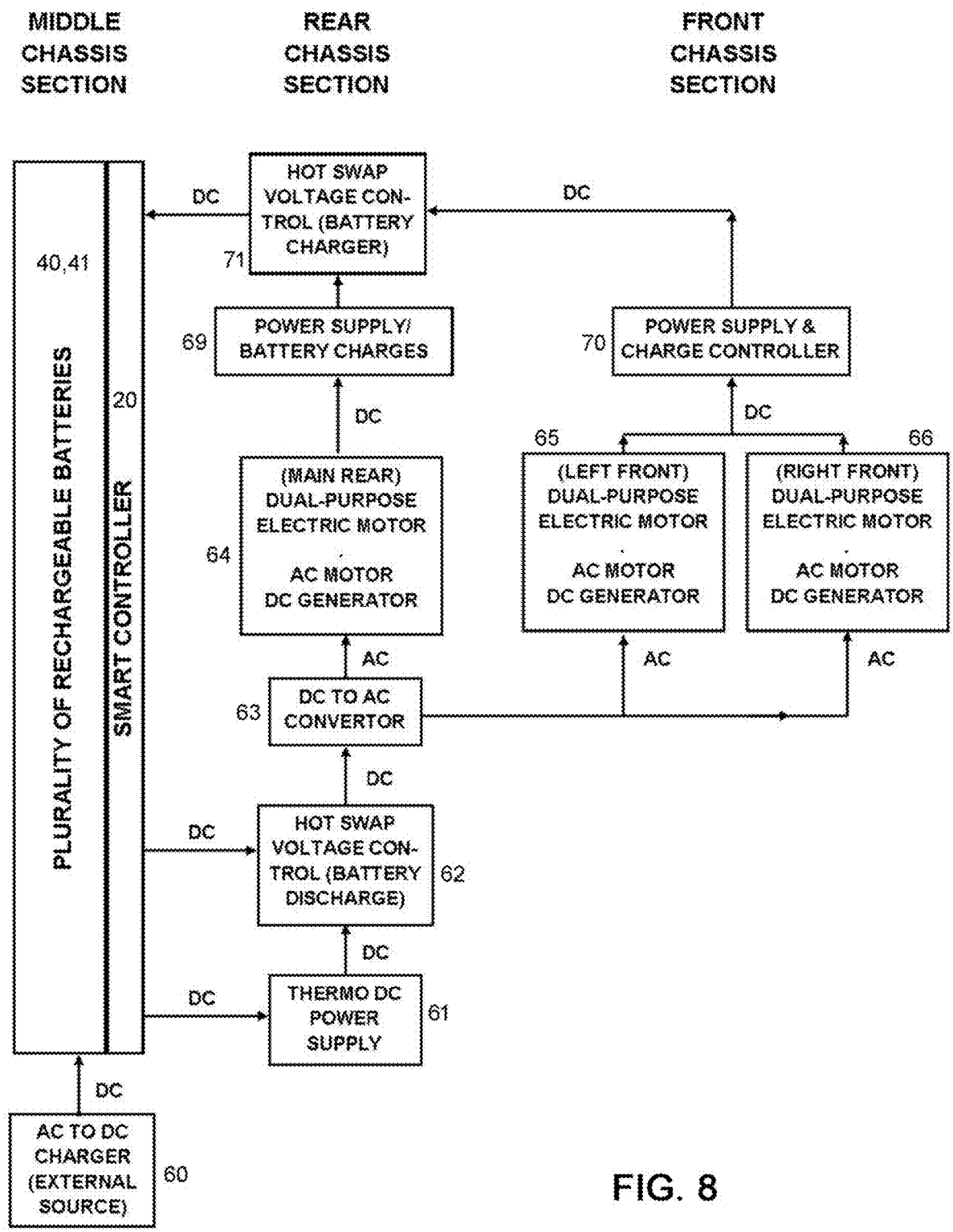
FIG. 8 is a flowchart, outlining the directional flow of the current, both AC and DC, taking place between the front, the rear and the middle chassis sections of the electric vehicle, in accordance with an exemplary embodiment of the present invention.

The thermal DC power supply 61 directs the DC current to a hot swap 62, made to control the current coming from the battery system 40 (the discharging current). As shown in FIG. 8, this current is directed toward the DC to AC converter 63, designed to supply AC current to the main 64 dual-purpose AC motor/DC generator system 50.

Figure 9:
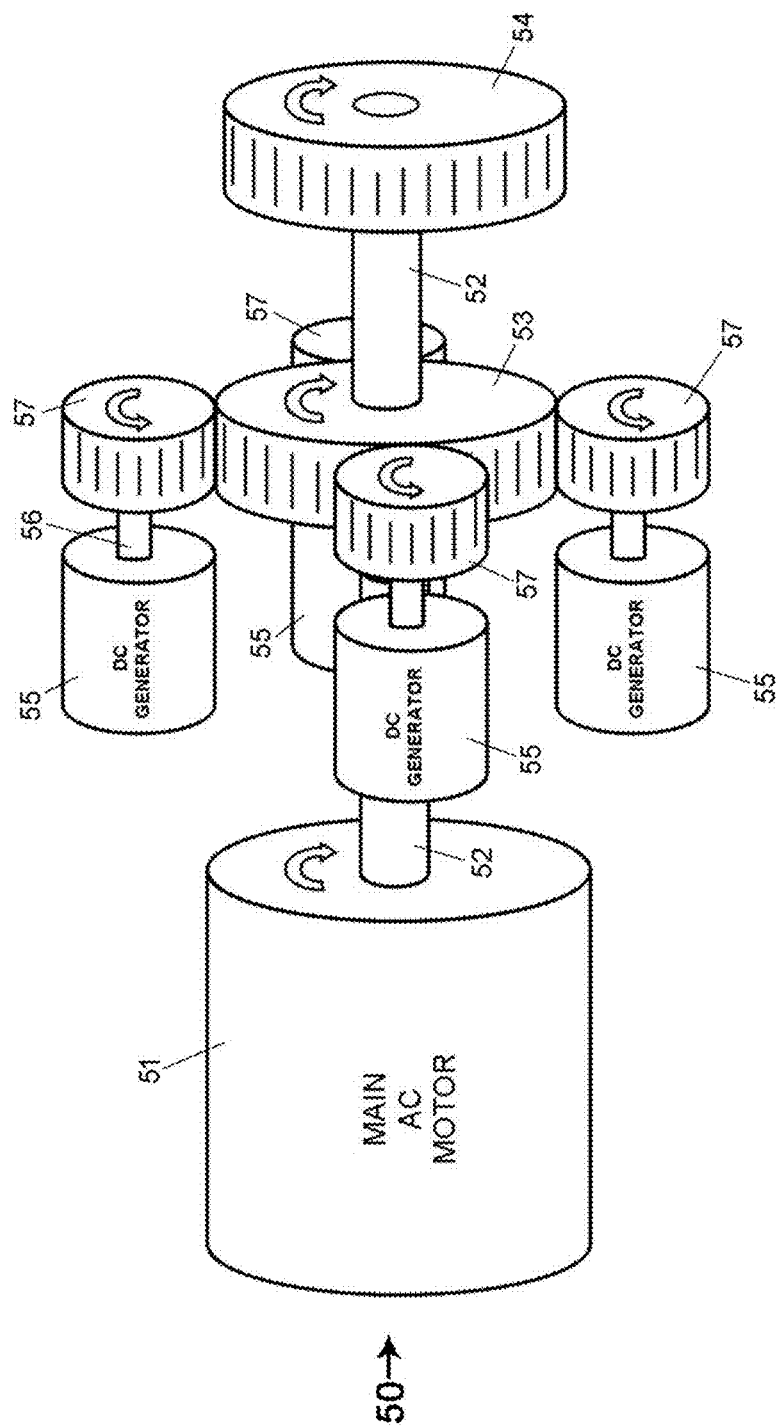
FIG. 9 is a perspective view of the dual-purpose AC motor/DC generator system, incorporating a plurality of DC generators, each having a shaft with a gear attached to the shaft's end, and an AC motor with an elongated shaft integrating two gears, wherein the first gear ("AC motor generators gear"), is positioned in the mid-section of the shaft, has been designed to mesh with the gears of the surrounding DC generators, and the second gear ("AC motor drive gear"), has been designed to mesh with gear box components, made to rotate the vehicle's rear and/or front axles, in accordance with an exemplary embodiment of the present invention.
Figure 10:
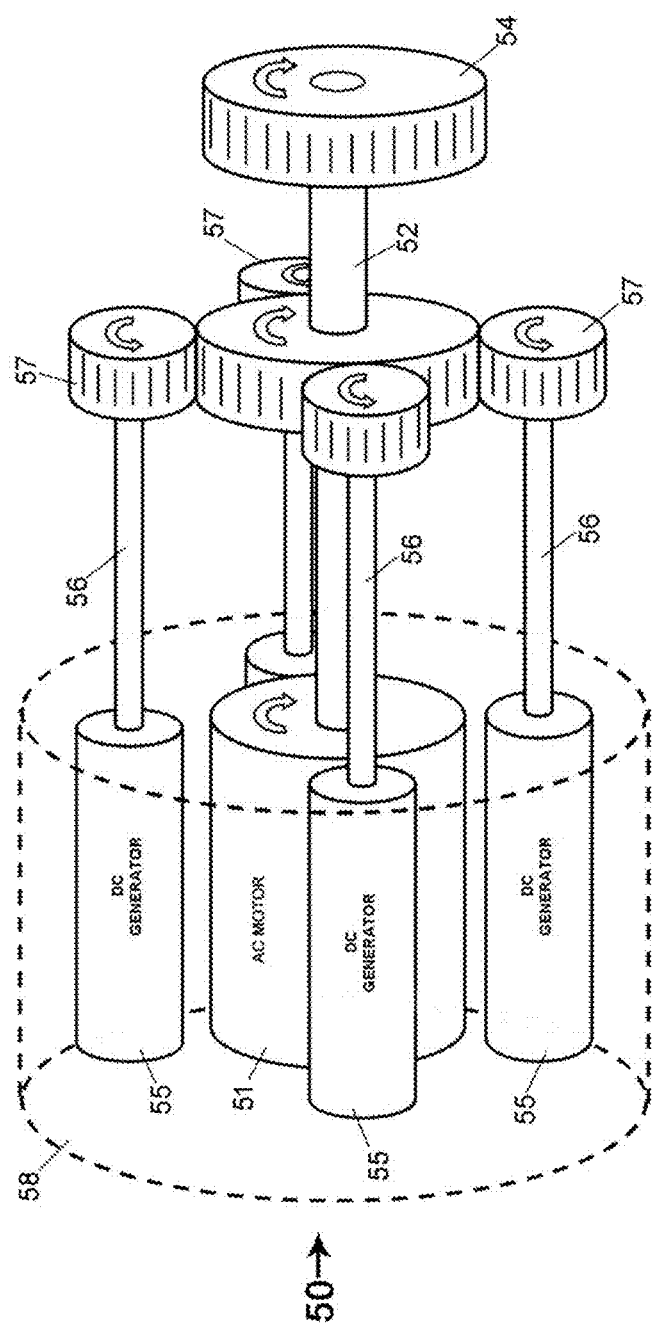
FIG. 10 is a perspective view of the dual-purpose AC motor/DC generator system (referenced in FIG. 9), with an outline (represented with broken lines) of an enclosure; wherein said enclosure is housing the centrally-located AC motor, and a plurality of DC generators, surrounding said AC motor; wherein said DC generators have elongated shafts enabling the gears attached to the end of each shaft to mesh with the AC motor generators gear, in accordance with an exemplary embodiment of the present invention.
Figure 11:
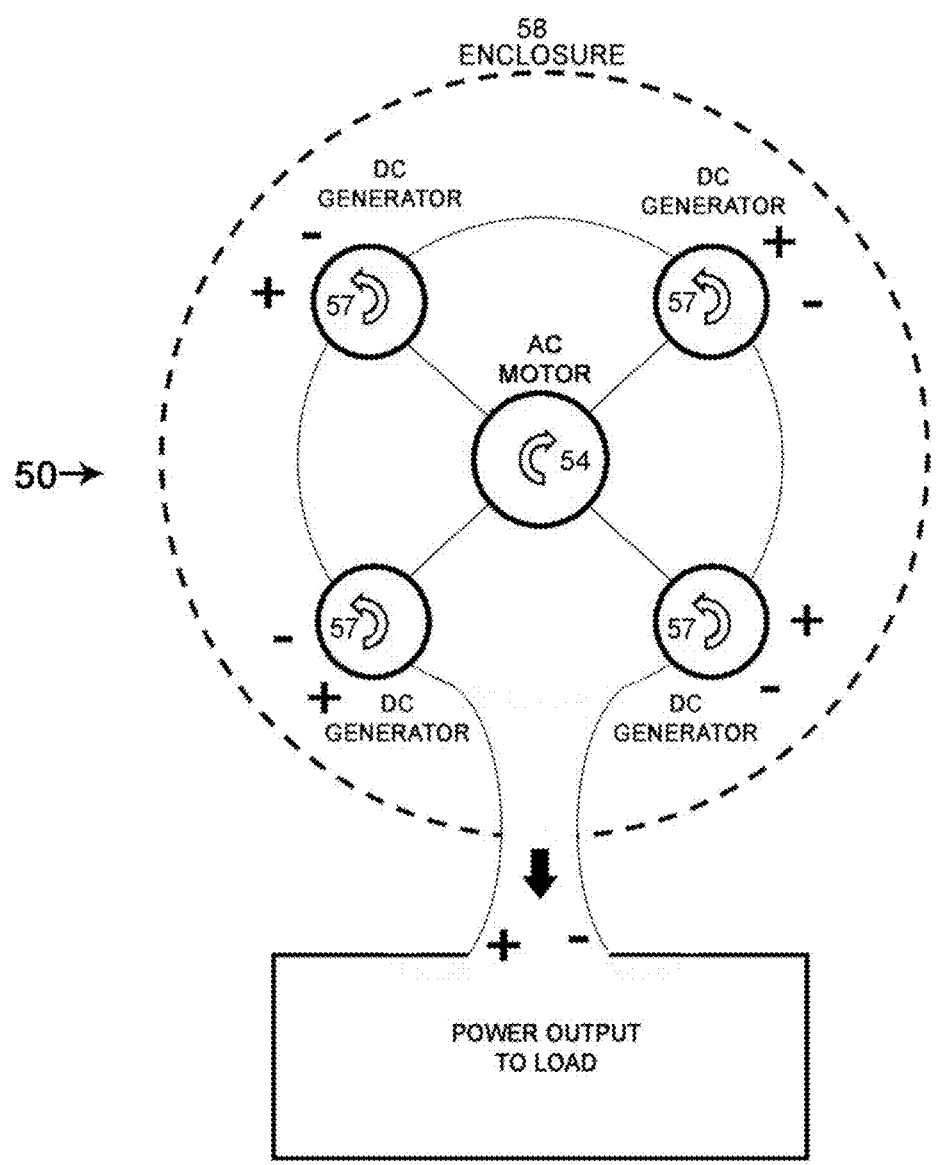
FIG. 11 is a diagram showing the internal electric wiring of the dual-purpose AC motor/DC generator system; wherein the enclosure (represented with a broken line) is housing a centrally-located AC motor surrounded by four DC generators, connected to said AC motor with meshing gears (referenced in FIGS. 9 and 10), in accordance with an exemplary embodiment of the present invention.

Each dual-purpose AC motor/DC generator system 50, shown in FIGS. 9, 10 and 11, incorporates an AC motor and a plurality of DC generators 55-57, housed in a common enclosure 58.

Each DC generator has a frame 55, with a protruding shaft 56, with a gear 57 attached to the shaft's end. The AC motor 51-54, also has a frame 51, with an elongated protruding shaft 52. The shaft 52 holds two gears 53 and 54.

The first gear (AC motor generators gear 53), is positioned in the mid-section of the shaft 52, and has been designed to mesh with the DC generator gears 57. The second gear (AC motor drive gear 54), has been designed to mesh with gear box 67/68 components, made to rotate the vehicle's rear 35 and/or front 36 axles.

This design, integrating the AC motor with the operations of multiple DC generators, enables energy efficiency. Specifically, each time the dual-purpose AC motor/DC generator system 50, via the gear box 67/68, rotates the vehicle's axle 35/36, it also rotates the DC generator gears 57, and produces the DC current. If the AC motor is not utilized, for rotating the vehicle's axle 35 or 36, which may be disconnected via the gear box 67 or 68, the DC generator continues to rotate, and continues to produce additional electricity. For the internal electric wiring of the dual-purpose AC motor/DC generator system reference FIG. 11.

The DC generated by the AC motor/DC generator system 64/50 is directed into the power supply 69, which used for recharging of the vehicle's batteries.

Figure 5:
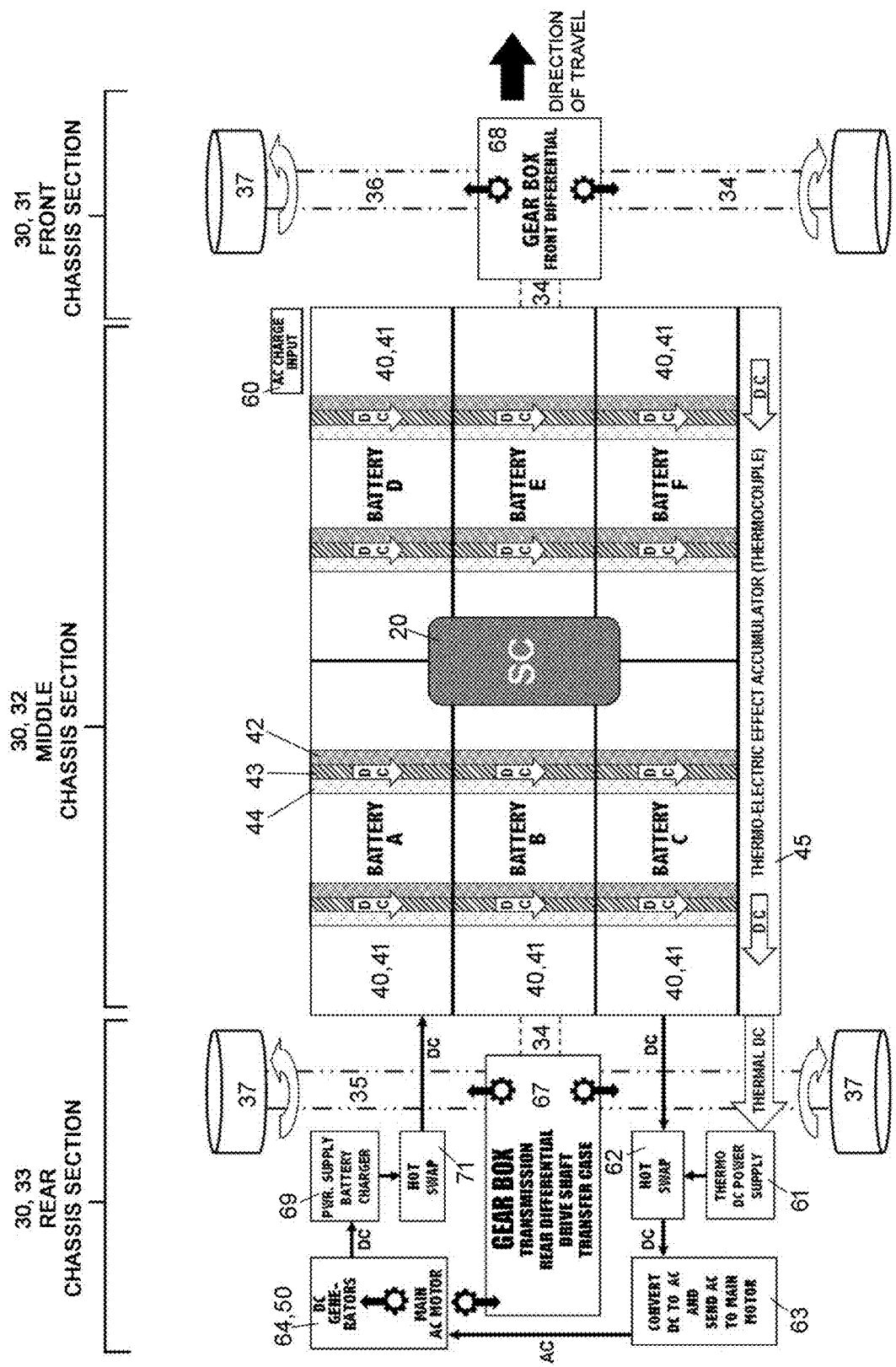
FIG. 5 is a diagram, showing the top view of the vehicle's rear, middle and the front chassis sections; wherein said middle chassis section houses the six rechargeable batteries and the smart controller (designed to manage the batteries' charging process); the rear chassis section, supported by the vehicle's rear axle, houses the rear gearbox, main dual-purpose AC motor, DC to AC converter, hot swap voltage controllers and the power supply; and the front chassis section houses the gearbox (front differential) designed to convert the vehicle into a four-wheel-drive system, when using only the main dual-purpose AC motor, in accordance with an exemplary embodiment of the present invention.
Figure 6:
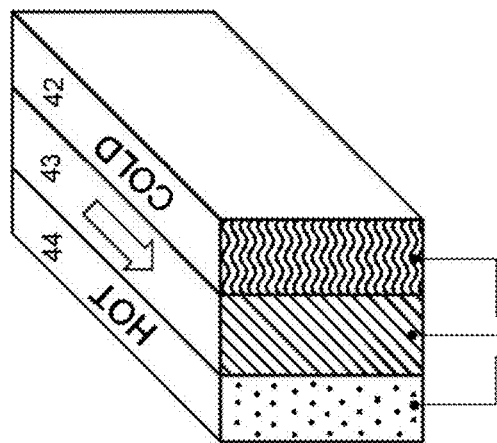
FIG. 6 is a perspective view of the thermo-electric generator system, comprising of the semi-conductor, sandwiched between the hot plate (absorbing the heat generated by the batteries), the cold plate (containing liquid coolant), allowing the semi-conductor to take advantage of the "Seebeck Effect" and by using the differences in temperatures, between the hot and the cold plate, produce electric current, in accordance with an exemplary embodiment of the present invention.
Figure 7:
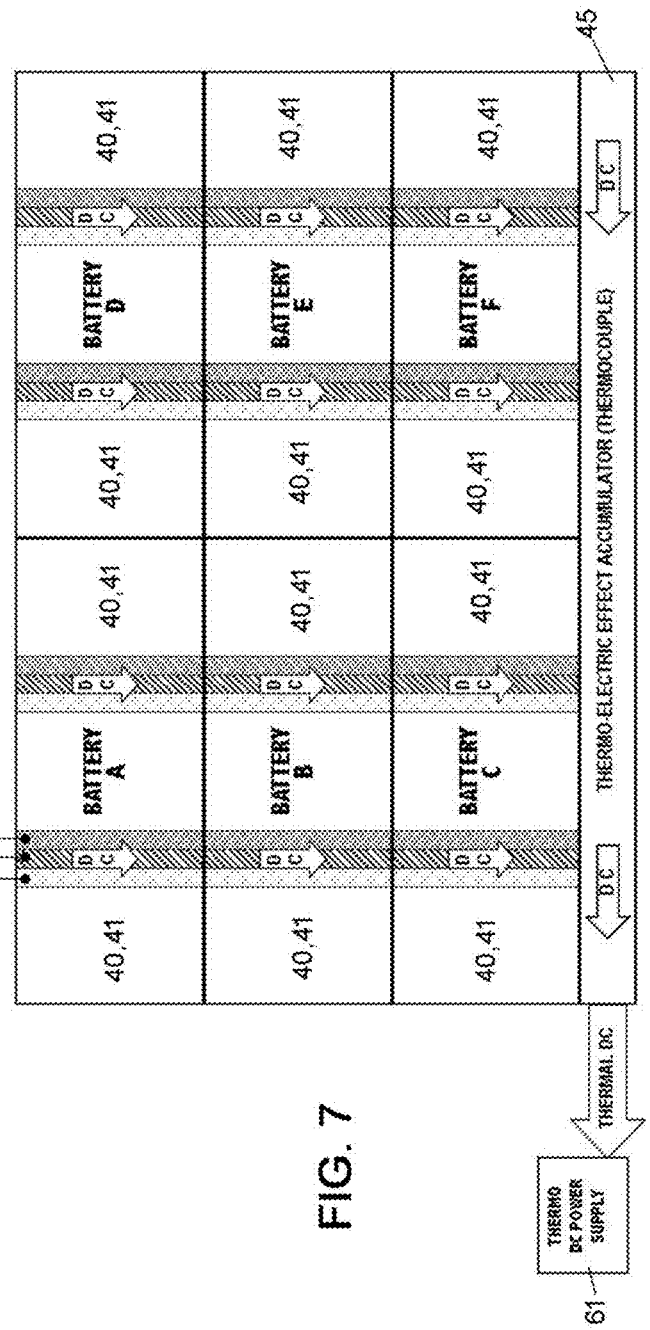
FIG. 7 is a diagram, showing the top view of the vehicle's middle chassis section, housing the rechargeable batteries, housing the thermo-electric plates (referenced in FIG. 6); shown are also arrows indicating the flow of DC current, generated by said thermo-electric plates, and the location of the thermal-electric accumulator (thermocouple) designed to direct the flow of said DC into the thermal DC power supply, located in the rear chassis of the vehicle.

As shown in FIG. 5, with the addition of a gear box 68, housing the front differential connected to the front axle 36, connected to the mechanical components disposed in the rear chassis section 30/33, the vehicle is capable of operating in four-wheel-drive mode. This configuration is less power efficient as it relies on the main AC motor/DC generator system 64/50, for both the power needed to propel the vehicle and continuous generation of the DC power.

Figure 4:
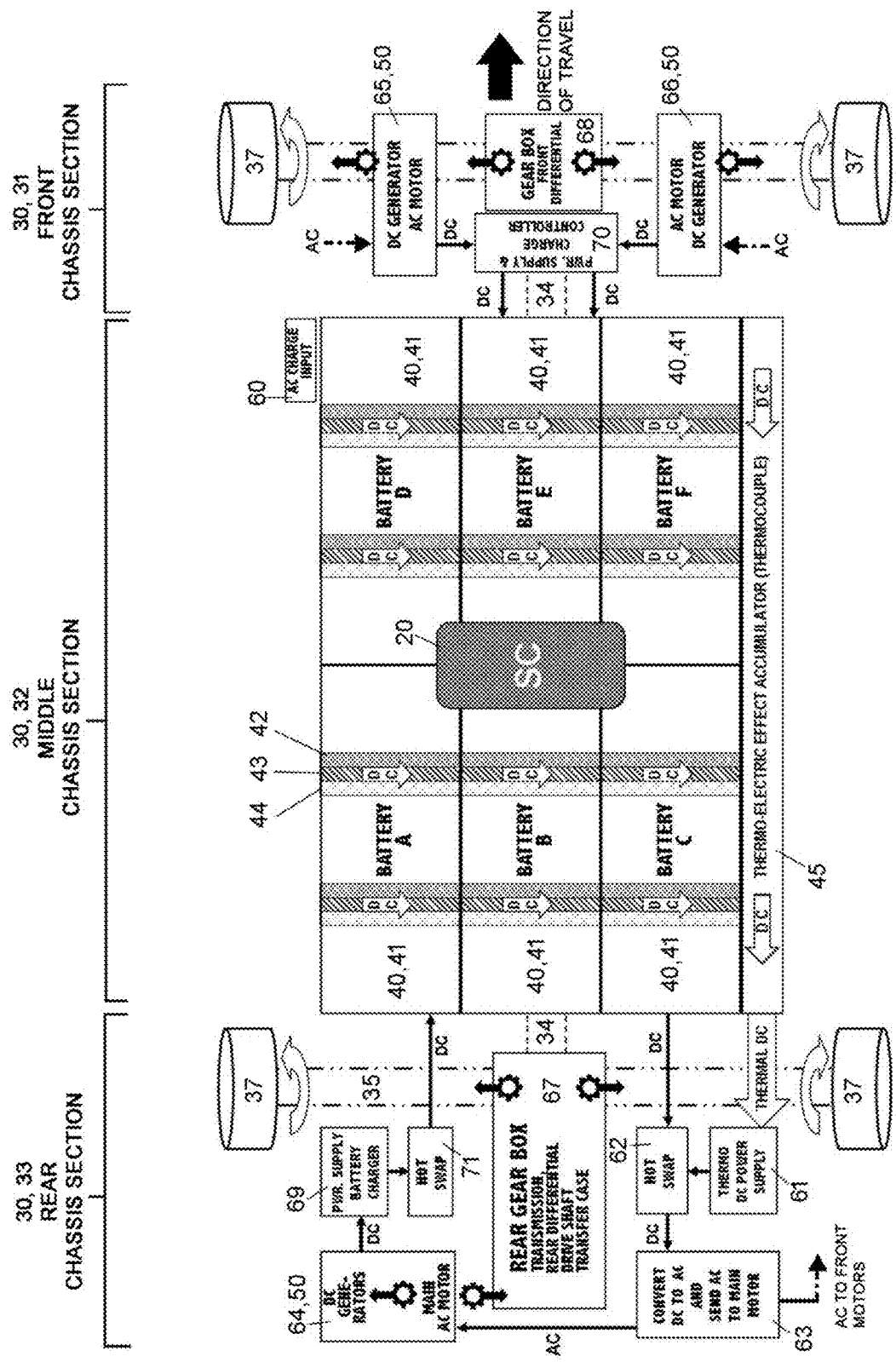
FIG. 4 is a diagram, showing the top view of the vehicle's rear, middle and the front chassis sections; wherein said middle chassis section houses the six rechargeable batteries and the smart controller (designed to manage the batteries' charging process); the rear chassis section, supported by the vehicle's rear axle, houses the rear gearbox, main dual-purpose AC motor, DC to AC converter, hot swap voltage controllers and the power supply; and the front chassis section houses left and right dual-purpose AC motor, gearbox (front differential), and power supply with charge controller, in accordance with an exemplary embodiment of the present invention.

As shown in FIG. 4, addition to the front chassis section 30/31 of two dual-purpose AC motor/DC generator systems 50 enhances the vehicle's power and makes it more energy efficient. Here, by adding the left AC motor/DC generator system 65/50 and the right AC motor/DC generator system 66/50 to the front axle 36, allows for converting the vehicle into either front-wheel drive mode or the super-efficient, all-wheel-drive mode.

The all-wheel-drive mode enables simultaneous, synchronized utilization of all AC motor/DC generator systems, including synchronized generation of DC power from all available sources (the three AC motor/DC generator systems, the DC thermal power and the direct battery charge). This mode is capable of producing a very high level of torque, which may be utilized when driving through very challenging terrain.

When operating in the front-wheel drive mode, the vehicle utilizes the two front AC motor/DC generator systems, the left 65/50 and the right 66/50, to rotate the axle 36. The systems receive the AC power from the DC to AC converter 63. The two AC motors are synchronized in its operation, and they continually generate DC current. This current is fed into the power supply and the charge controller 70, which directs the current to the hot swap voltage control/battery charger 71, as shown in FIG. 8.

When operating in the front-wheel drive mode, the main AC motor 64/50 rotates in idled mode (rotation provided by spinning rear axle 35) allowing the DC generators to keep producing more DC power. This situation is reversed when the vehicle operates in rear-wheel-drive mode. Here the main AC motor 64/50 rotates the rear axle 35 enabling the vehicle's motion, and the two front AC motor/DC generator systems, the left 65/50 and the right 66/50 spin in idle mode (rotation provided by spinning front axle 36) allowing their DC generators continuing to produce DC power.

I claim:
1. An electric vehicle, comprising:
    at least one rechargeable battery having
        a plurality of charging cells for converting chemical energy into direct electric current,
        a plurality of heating compartments for absorbing heat generated by the charging cells when converting chemical energy into direct electric current, a plurality of cooling compartments for storing coolant fluid, thereby creating predetermined temperature differences between the heating compartments and the cooling compartments, a plurality of semiconductor compartments, sandwiched between the heating compartments and the cooling compartments, for converting predetermined temperature differences between the heating compartments and the cooling compartments into direct electric current, at least one thermal electric accumulator for collecting direct electric current generated by the semiconductor compartments;

a smart controller for controlling charging and recharging the battery;

a direct electric current to alternating electric current converter for converting direct electric current into alternating electric current;

wherein said direct electric current to alternating electric current converter is configured to convert direct electric current delivered from the battery into alternating electric current;

wherein said direct electric current to alternating electric current converter is configured to convert direct electric current delivered from the thermal electric accumulator into alternating electric current;

at least one gearbox for providing speed and torque conversions;

at least one dual purpose alternating current motor and direct current generator system for generating direct electric current and for producing rotational energy, having an alternating electric current motor having an alternating current motor frame, an alternating current motor shaft, an alternating current motor generator gear, an alternating current motor drive gear, at least one direct electric current generator having a direct current generator frame, a direct current generator shaft, a direct current generator gear, an enclosure for housing the alternating electric current motor and the direct electric current generator;

wherein the alternating electric current motor rotates the alternating electric current motor shaft and attached thereto the alternating current motor generator gear, configured to mesh with the direct current generator gear thereby enabling the direct electric current generator to produce direct electric current delivered to the battery for recharging, the alternating current motor drive gear, configured to transfer the rotational energy generated by the alternating electric current motor to the gearbox;

a vehicle chassis having mounted thereunder at least two rotatable wheels, the battery, the smart controller, the direct electric current to alternating electric current converter, the gearbox, the dual purpose alternating current motor and direct current generator system; and wherein the gearbox is configured to transfer the rotational energy to the rotatable wheels for enabling said vehicle chassis to roll along a surface.

2. The electric vehicle of claim 1 further comprises:
an external charger for connecting to an external source of alternating electric current for charging and recharging of the battery.

3. The electric vehicle of claim 2 wherein:
said direct electric current to alternating electric current converter is configured to convert direct electric current delivered from the battery via a hot swap.

4. The electric vehicle of claim 3 wherein:
said direct electric current to alternating electric current converter is configured to convert direct electric current delivered from the thermal electric accumulator via a thermo direct electric current power supply and the hot swap.

5. The electric vehicle of claim 4 wherein:
the alternating current motor generator gear, configured to mesh with the direct current generator gear thereby enabling the direct electric current generator to produce direct electric current delivered to the battery via a power supply and battery charger and the hot swap.

6. The electric vehicle of claim 5 wherein:
the gearbox is configured to transfer the rotational energy to the rotatable wheels via a rotatable rear axle, a rotatable front axle, and a rotatable drive shaft.

7. The electric vehicle of claim 6 wherein:
said vehicle chassis is subdivided into
a rear section for mounting thereto the thermo direct electric current power supply, the hot swap, the direct electric current to alternating electric current converter, the dual purpose alternating current motor and direct current generator system, the power supply and battery charger, the gearbox, the wheels, and the rear axle;

a middle section for mounting thereto the battery, the smart controller, and the drive shaft; and a front section for mounting thereto the gearbox, the wheels, and the front axle.

8. The electric vehicle of claim 7 wherein:
the smart controller controls charging, recharging, and transfer of rotational energy;

direct electric current generated by the charging cells of the battery is sent to the hot swap;

direct electric current accumulated by the thermal electric accumulator is sent to the thermo direct electric current power supply and therefrom to the hot swap;

the hot swap sends direct electric current to the direct electric current to alternating electric current converter;

the direct electric current to alternating electric current converter sends alternating electric current to the dual purpose alternating current motor and direct current generator system;

the dual purpose alternating current motor and direct current generator system sends direct electric current to the power supply and battery charger and provides rotational energy to the gearbox;

the power supply and battery charger sends the direct electric current to the hot swap;

the hot swap sends direct electric current to the battery thereby recharging the battery; and the gearbox transfers rotational energy to the rear axle, and via the drive shaft to the front axle, thereby causing the electric vehicle to roll along a surface.

9. An electric vehicle, comprising:
at least one rechargeable battery having
a plurality of charging cells for converting chemical energy into direct electric current, a plurality of heating compartments for absorbing heat generated by the charging cells when converting chemical energy into direct electric current, a plurality of cooling compartments for storing coolant fluid, thereby creating predetermined temperature differences between the heating compartments and the cooling compartments, a plurality of semiconductor compartments, sandwiched between the heating compartments and the cooling compartments, for converting predetermined temperature differences between the heating compartments and the cooling compartments into direct electric current, at least one thermal electric accumulator for collecting direct electric current generated by the semiconductor compartments;

an external charger for connecting to an external source of alternating electric current for charging and recharging of the battery;

a smart controller for controlling charging and recharging of the battery;

a thermo direct electric current power supply, for distributing direct electrical current collected by the thermal electric accumulator;

at least one hot swap for limiting flow of direct electric current;

a direct electric current to alternating electric current converter;

a vehicle chassis having mounted thereunder four rotatable wheels, two of the four wheels are connected via a rotatable rear axle, two of the four wheels are connected via a rotatable front axle, a rotatable drive shaft;

a rear differential gearbox for providing speed and torque conversions to the rear axle;

a front differential gearbox for providing speed and torque conversions to the front axle;

a main rear dual purpose alternating current motor and direct current generator system;

a left front dual purpose alternating current motor and direct current generator system;

a right front dual purpose alternating current motor and direct current generator system;

wherein the main rear dual purpose alternating current motor and direct current generator system, the left front dual purpose alternating current motor and direct current generator system, and the right front dual purpose alternating current motor and direct current generator system, each comprise an alternating electric current motor having an alternating current motor frame, an alternating current motor shaft, an alternating current motor generator gear, an alternating current motor drive gear, at least one direct electric current generator having a direct current generator frame, a direct current generator shaft, a direct current generator gear, an enclosure for housing the alternating electric current motor and the direct electric current generator;

wherein the alternating electric current motor rotates the alternating electric current motor shaft and attached thereto the alternating current motor generator gear, configured to mesh with the direct current generator gear thereby enabling the direct electric current generator to produce direct electric current, and the alternating current motor drive gear, configured to transfer the rotational energy of the alternating electric current motor to the gearbox and to the rear differential gearbox, and via the drive shaft to the front differential gearbox;

a power supply and charge controller for distributing direct electric current generated by the left front dual purpose alternating current motor and direct current generator system, and the right front dual purpose alternating current motor and direct current generator system;

a power supply and battery charger for distributing direct electric current generated by the main rear dual purpose alternating current motor and direct current generator system;

wherein said vehicle chassis is subdivided into a rear section for mounting thereto the thermo direct electric current power supply, the hot swap, the direct electric current to alternating electric current converter, the main rear dual purpose alternating current motor and direct current generator system, the power supply and battery charger, the rear differential gearbox, the two wheels, the rear axle, a middle section for mounting thereto the battery, the external charger, the smart controller, the drive shaft, a front section for mounting thereto the two wheels, the front axle, the front differential gearbox, the power supply and charge controller, the left front dual purpose alternating current motor and direct current generator system, the right front dual purpose alternating current motor and direct current generator system; and wherein by using the smart controller direct electric current generated by the charging cells of the battery is sent to the hot swap, direct electric current accumulated by the thermal electric accumulator is sent to the thermo direct electric current power supply and therefrom to the hot swap, the hot swap sends direct electric current to the direct electric current to alternating electric current converter, the direct electric current to alternating electric current converter sends alternating electric current to the main rear dual purpose alternating current motor and direct current generator system, the left front dual purpose alternating current motor and direct current generator system, and the right front dual purpose alternating current motor and direct current generator system, the main rear dual purpose alternating current motor and direct current generator system sends direct electric current to the power supply and battery charger, and provides rotational energy to the rear differential gearbox, the power supply and battery charger sends the direct electric current to the hot swap, the left front dual purpose alternating current motor and direct current generator system, and the right front dual purpose alternating current motor and direct current generator system, provide rotational energy to the front differential gearbox, and sends direct electric current to the power supply and charge controller, the power supply and charge controller sends the direct electric current to the hot swap, the hot swap sends direct electric current to the battery thereby recharging the battery, the rear differential gearbox transfers rotational energy to the rear axle, and the front differential gearbox transfers rotational energy to the front axle, thereby causing the electric vehicle to roll along a surface.

\* \* \* \* \*